US006311317B1

(12) United States Patent
Khoche et al.

(10) Patent No.: US 6,311,317 B1
(45) Date of Patent: Oct. 30, 2001

(54) PRE-SYNTHESIS TEST POINT INSERTION

(75) Inventors: Ajay Khoche, Sunnyvale; Harbinder Singh, San Jose; Dhiraj Goswami, Mountain View; Denis Martin, Palo Alto, all of CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/282,304

(22) Filed: Mar. 31, 1999

(51) Int. Cl.⁷ ........................................................ G06F 17/50
(52) U.S. Cl. .................................................. 716/18; 716/4
(58) Field of Search ..................... 716/4, 6, 18; 714/733, 714/734

(56) References Cited

U.S. PATENT DOCUMENTS

| 5,696,771 | 12/1997 | Beausang et al. | |
| 5,703,789 | 12/1997 | Beausang et al. | 364/489 |
| 5,903,466 | * 11/1999 | Beausang et al. | 364/488 |
| 6,185,721 | * 2/2001 | Hosokawa | 716/5 |
| 6,237,132 | * 5/2001 | Dean et al. | 716/18 |

* cited by examiner

Primary Examiner—Matthew Smith
Assistant Examiner—Leigh Marie Garbowski
(74) Attorney, Agent, or Firm—Wagner Murabito & Hao LLP

(57) ABSTRACT

A method of and system for inserting test points within an integrated circuit design. According to the present invention, test points are inserted early in the electronic design process and prior to logic synthesis such that the problem of design constraint violation can be avoided. One embodiment of the present invention includes the computer implemented steps of receiving an unmapped netlist of an integrated circuit design, and receiving from an external source, data that indicates the location and the desired functionality of the test point to be inserted. Thereafter, the present invention inserts a generic test point circuit at the indicated location and generates a modified unmapped netlist. Subsequently, the present invention performs a logic synthesis process on the modified unmapped netlist where the generic test point circuit is degenerated into an actual test point circuit for performing the desired functionality. The actual test point circuit may also be merged with other circuitries of the integrated circuit to produce a more efficient design.

21 Claims, 17 Drawing Sheets

PRE-SYNTHESIS TEST POINT INSERTION

FIELD OF THE INVENTION

The field of the present invention pertains to the field of electronic design automation. More particularly, aspects of the present invention pertain to methods and systems for improving testability of an integrated circuit design.

BACKGROUND OF THE INVENTION

Complicated integrated circuits such as ASICs (application specific integrated circuits) and FPGAs (field programmable gate arrays) are typically designed using CAD (computer aided design) tools. The development of complicated integrated circuits with the aid of CAD tools is referred to as electronic design automation, or EDA. Design, checking, and testing of large-scale integrated circuits are so complex that the use of programmed computer systems are required for realization of normal circuits. This is partly because the integrated devices are inherently complex and partly because the circuit design needs to be decomposed into simpler functions which are recognized by the CAD tool. It is also partly because considerable computation is required in order to achieve an efficient implementation of the resultant network. The result of the computerized design process is a detailed specification defining a complex integrated circuit in terms of a particular technology. This specification can be regarded as a template for the fabrication of the physical embodiment of the integrated circuit using transistors, routing resources, etc.

Integrated circuit designs can be represented in different levels of abstraction, such as the register transfer level (RTL) and the logical level, using a hardware description language (HDL), also called high level design language. Two exemplary forms of HDL are Verilog and VHDL. The integrated circuit can be represented by different layers of abstractions (e.g., behavioral levels, structural levels and gate levels). An RTL level is an intermediary level of abstraction between the behavioral and structural levels. HDL descriptions can represent designs of all these levels.

The behavior levels and RTL levels consist generally of descriptions of the circuit expressed with program-like constructs, such as variables, operators conditional loops, procedures, and functions. At the logic level, the descriptions of the circuit are expressed with Boolean equations. The HDL can be used along with a set of circuit constraints as an input to a computer-implemented compiler (also called a "silicon compiler"). The computer-implemented compiler program processes this description of the integrated circuit and generates therefrom a detailed list of logic components and the interconnections between these components. This list is called a "netlist." The components of a netlist can include primitive cells such as full-adders, NAND gates, NOR gates, XOR gates, latches, and D-flip flops, etc., and their interconnections can be used to form a custom design.

In processing the HDL input, the compiler first generates a netlist of generic primitive cells that are technology independent. The compiler then applies a particular cell library to this generic netlist (this process is called mapping) in order to generate a technology-dependent mapped netlist. The mapping process converts the logical representation which is independent of technology into a form which is technology dependent. The mapped netlist has recourse to standard circuits, or cells, which are available within a cell library forming a part of the data available to the computer system.

Compiler programs and mapping programs are well known in the art, and several of these systems are described in U.S. Pat. No. 5,406,497, by Altheimer et al.

As ASICs and other complex integrated circuits have become more complex and more dense, they have become progressively harder to test in order to ensure correct and complete functionality. For example, with current technology, as the number of gates and transistors increase, the time which an ASIC emerging from a fabrication process line spends in testing increases as well. This increase incurs an additional cost on ASIC manufacturing. The testing cost can be very significant for the latest and largest ASIC designs. In addition, as more complex systems-on-a-chip devices proliferate, which, for example, integrate complex logic units (integer units, floating point units, memory, etc.) into a single chip, and as newly-designed processors begin to take advantage of the ability to integrate large quantities of memory on-chip, it has become necessary to increase the comprehensiveness, efficiency, and accuracy of the design checking and testing schemes utilized to ensure proper operation of these devices (e.g., ASICs, complex integrated circuits, field programmable gate arrays, etc.).

Thus, an increasingly important part of the logic synthesis process involves designing for testability. Programs that aid in the testability process of logic synthesis are called design for test (DFT) processes. One approach to DFT is to take the mapped netlist generated from a compiler and add and/or replace certain memory cells and associated circuitry with special memory cells that are designed to allow the application of test vectors to certain logic portions of the integrated circuit. The act of applying test vectors is called stimulation of the design, and the special memory cells and associated circuitry are referred to as DFT implementations. The same memory cells can be used to capture the output of the circuitry for observation and compare this output to the expected output in an effort to determine if circuit (e.g., manufacturing) defects are present. Issues concerning controllability deal with facilitating the application of the test vectors to the circuitry to be tested. On the other hand, issues concerning observability deal with facilitating the capturing the output of the circuitry.

Another approach to DFT is to take the mapped netlist generated form the compiler, and insert observe/control points, or test points, to certain logic portions of the integrated circuit design. Appropriate test vectors are then applied to the input of the integrated circuit design and to the test points and the responses to the test vectors are monitored. Observe points are particularly useful for detecting otherwise unobservable faults. For example, in the circuit 100 illustrated in FIG. 1A, it may be impossible to detect a fault (e.g., a stuck-at-0 fault) at an internal node 102 from the circuit output. As illustrated in FIG. 1B, by incorporating an observe point at the internal node 102, a specific input pattern may be applied to the circuit 100 to detect the fault.

FIGS. 2A and 2B illustrate the usefulness of adding a control point within a circuit. As shown in FIG. 2A, it may be impossible to detect a stuck-at-1 fault with the X-NOR gate 210 of the circuit 200 if the outputs of the logic block 220 are always the same. This problem may be circumvented by the addition of a control point to the circuit 200. A modified circuit 250 including an AND gate 230 is illustrated in FIG. 2B. During normal operation, the control input of the AND gate 230 is set at logic 1. To test for a stuck-at-1 fault at the output of the X-NOR gate, the control input of the AND gate 230 is set at logic 0 and an input combination that produces logic 1 at the outputs of the logic block 220 is applied. In this way, the testability of the circuit 200 is improved.

An exemplary flow chart diagram of a typical logic synthesis process, including a DFT process, is shown in FIG.

3. The processes 300 described with respect to this flow chart are implemented within a computer system in a CAD environment. HDL descriptions of the integrated circuit enter at block 301. Accompanying the HDL 301 is a set of performance constraints 305 applicable to the design which typically includes timing, area, power consumption, and other performance related limitations that the compiler 325 will attempt to satisfy when synthesizing the integrated circuit design. Constraints 305 can also include non-performance related constraints, such as structural and routing constraints. Compiler 325 consists of a generic compiler 303 (also called an HDL compiler, RTL synthesizer, or architectural optimizer) that inputs the HDL 301 description and generates therefrom a technology independent or "generic" netlist 307, which is also dependent on the constraints 305. As discussed above, the netlist 307 is a list of technology-independent components, or operators, and the interconnections between them.

The generic netlist 307 is then inputted to a design compiler 309 that includes a computer-implemented logic optimization procedure and a mapping procedure which interfaces with a technology-dependent cell library 330 (e.g., from LSI, VLSI, TI, or Xilinx technologies, etc.). The cell library 330 contains specific information regarding the cells of the specific technology selected, such as the cell logic, number of gates, area consumption, power consumption, pin descriptions, etc., for each cell in the library 330. Logic optimization procedure of block 309 includes structuring and flattening procedures. The mapping procedure of block 309 generates a gate level mapped netlist 311 that is technology dependent, having cells specifically selected to satisfy the constraints 305. At this point, this gate-level mapped netlist 311 consists of "mission mode" circuitry.

At block 313, a test point insertion process is performed to implement testability cells or "test mode" cells into the overall integrated circuit design. In the process 313, particular nets of the mapped netlist 311 are selected for test point insertion, and logic gates for implementing test points are inserted into the gate-level mapped netlist 311. The output of this test point insertion process is a DFT netlist 315 including both mission mode circuitry and test point circuitries. In addition to the test point insertion process, other DFT processes, such as scan insertion, can also be applied.

One problem that occurs in the prior art logic synthesis process 300 is that the test point insertion process 313 does not take into account its impact on the mission mode constraints (e.g., constraints 305). Specifically, the addition of the testability cells (e.g., test points), and the addition of other dedicated connections required for operation of the test points can cause the overall design to violate one or more of the defined constraints 305.

Therefore, a second compile process 317 of FIG. 3 (full or incremental compile) is often invoked by the prior art process 300 in order to optimize more effectively the DFT netlist 315 to the constraints 305. It should be appreciated that an incremental compile (e.g., incremental compile 317) may not process all existing structure as in a full compile. An incremental compile may only apply high level logical optimization to the unmapped portions of the design. Those unmapped portions can then be mapped using a technology-dependent library. However, the incremental compile still applies mapping optimizations iteratively on the entire DFT netlist 315. As a result, processing time to perform the second compile process 317 can be on the order of weeks given conventional CAD technology and circuit complexity.

After the second compile process 317 of FIG. 1 completes, a DFT netlist 319 is again generated that contains the testability cells, and, at block 321, the prior art then performs a test to determine if the DFT netlist 319 meets the mission constraints (e.g., constraints 305). If the netlist 319 meets mission mode constraints, at block 323, other circuit synthesis procedures continue until the integrated circuit design can be fabricated onto a substrate and tested.

However, as is often the case, the addition of the testability cells by the test point insertion process 313 does not allow the second compile process 317 to meet test mode constraints 305 without a design modification to the original HDL program 301. In such case, the overall process 300 flows from block 321 back to the HDL 301 where the architect modifies the HDL program 301 so that the addition of the testability cells and other resources will eventually satisfy, when possible, the given test mode constraints 305 after the incremental compile step 317 is again executed.

The prior art process 300 of FIG. 3 has several disadvantages. It is disadvantageous to execute a second substantial compile process 317 in an attempt to match the testability cells and linking resources to the given set of constraints (e.g., test mode and mission mode). Although this process can be an incremental compile step in that many of the gate level connections are not removed, mapping optimization portions of this compile process still operate in an iterative fashion over the entire design. The addition of this second compile process, using conventional technology, delays the overall integrated circuit synthesis process by as much as one to two weeks. Even after this long delay, there are no guarantees that the incremental compile process 317 will generate a scannable netlist satisfying the constraints 305. In this case, a time-consuming task of returning to the HDL for redesign is required. This process involves the chip architect designers once more, and, therefore, it is unclear under the prior art system when a designer can sign off on his or her work in the design process.

Thus, what is needed is a method of and system for improving testability of an integrated circuit design without delaying the overall integrated circuit synthesis process. What is further needed is a method of and system for implementing testability circuitry, particularly test point circuitry, for an integrated circuit design such that a second compile process can be obviated.

SUMMARY OF THE DISCLOSURE

The present invention provides for a method of and system for inserting a test point within an integrated circuit design early in the design process to avoid the problem of design constraint violation which occurs when testability cells are added to the integrated circuit design after logic synthesis. Significantly, the present invention further provides for a generic pre-synthesis test point circuit that can be inserted prior to logic synthesis in a computer-aided design (CAD) system.

In accordance with the present invention, a generic pre-synthesis test point circuit is inserted into an unmapped netlist description of an integrated circuit design, but before logic synthesis processes such as logic and mapping optimization are applied. In one embodiment, the pre-synthesis test point insertion process of the present invention receives data from an external source (e.g., a user of the CAD system or another synthesis tool) the location and the desired functionality of the test point to be inserted. The pre-synthesis test point insertion process then generates a modified unmapped netlist by configuring a generic test point circuit according to the external data, and by adding the configured generic test point circuit into the unmapped netlist. Thereafter, logic synthesis and mapping processes are applied to reduce the modified unmapped netlist and to generate a gate-level mapped netlist that includes the actual implementation of the test point. Because logic optimization and mapping processes are performed on both mission mode and test point circuitries, the problem of constraint violation is avoided.

In one embodiment of the present invention, the generic test point circuit includes input ports for receiving a number of control signals: a test mode signal, a test point enable signal and a test data signal. According to the present invention, the generic test point circuit is configured for the desired functionality by setting the control signals to certain predetermined values. By setting the control signals to certain predetermined values, logic synthesis and optimization processes applied thereafter will then be able to remove any redundant logic of the generic test point circuit and arrive at the actual implementation of the test point.

The present invention further provides for several types of generic pre-synthesis test point circuits for insertion. In one embodiment, the generic pre-synthesis test point circuit is configured for inserting between a net. In another embodiment, the generic pre-synthesis test point circuit is configured for a tri-stated net. The present invention further provides for "control-only" and "observe-only" test points.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE PREFERRED EMBODIMENTS

In the following detailed description of the preferred embodiments, for purposes of explanation, numerous specific details are set forth in order to provide a thorough understanding of the present invention. However, it will be apparent to one skilled in the art that the present invention may be practiced without these specific details. In other instances, well-known structures and devices are not described in detail in order to avoid obscuring aspects of the present invention.

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here and generally conceived to be a self-consistent sequence of steps of instructions leading to a desired result. The steps are those requiring physical manipulations of data representing physical quantities to achieve tangible and useful results. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving", "determining", "generating", "associating", "assigning" or the like, refer to the actions and processes of a computer system, or similar electronic computing device. The computer system or similar electronic device manipulates and transforms data represented as electronic quantities within the computer system's registers and memories into other data similarly represented as physical quantities within the computer system memories into other data similarly represented as physical quantities within the computer system memories or registers or other such information storage, transmission, or display devices.

Figure 1A:
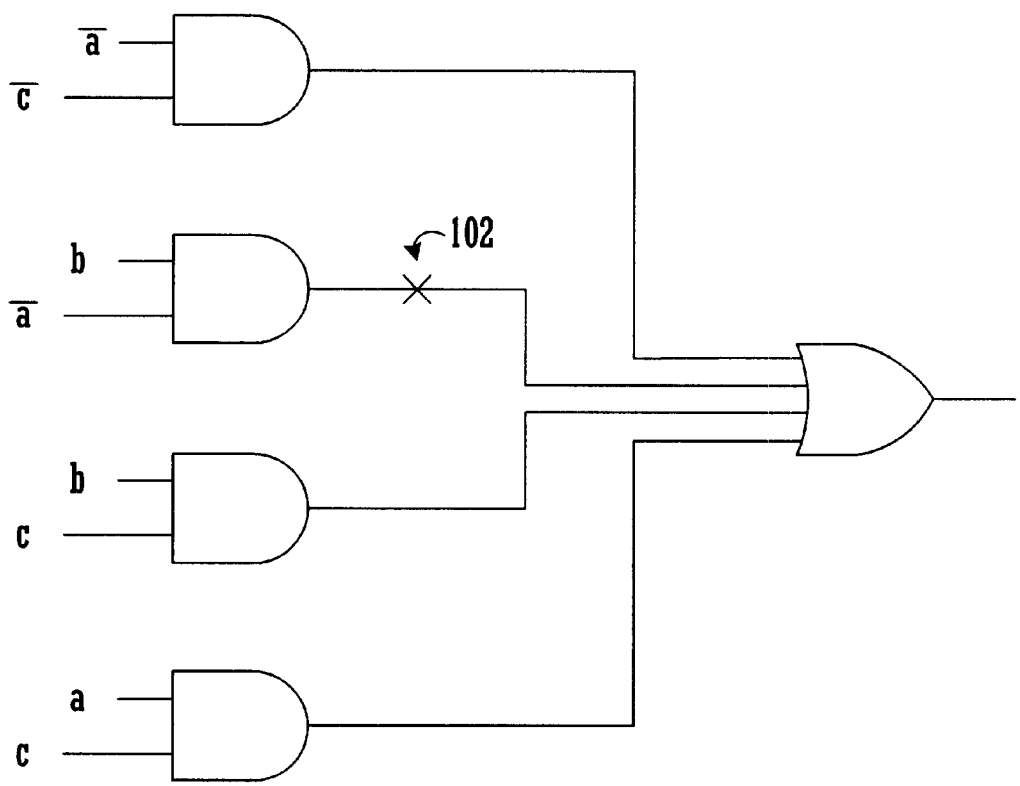
FIG. 1A is a schematic of a circuit having an internal node that is difficult to be tested.
Figure 1B:
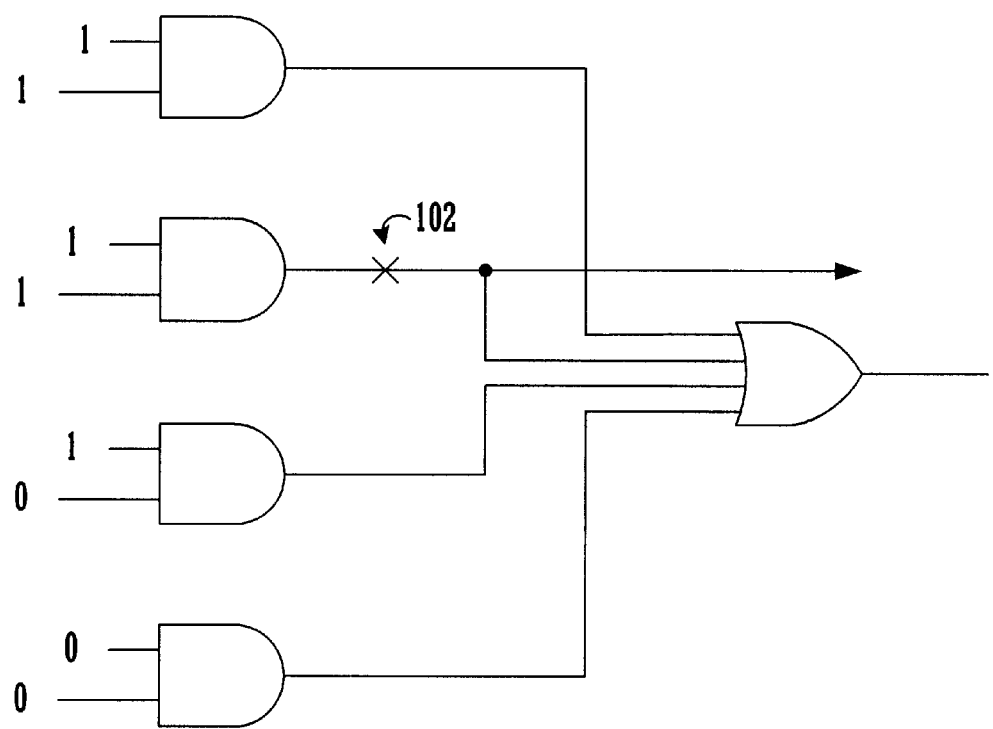
FIG. 1B is a schematic diagram of the circuit of FIG. 1A with an observe point added using prior art techniques.
Figure 2A:
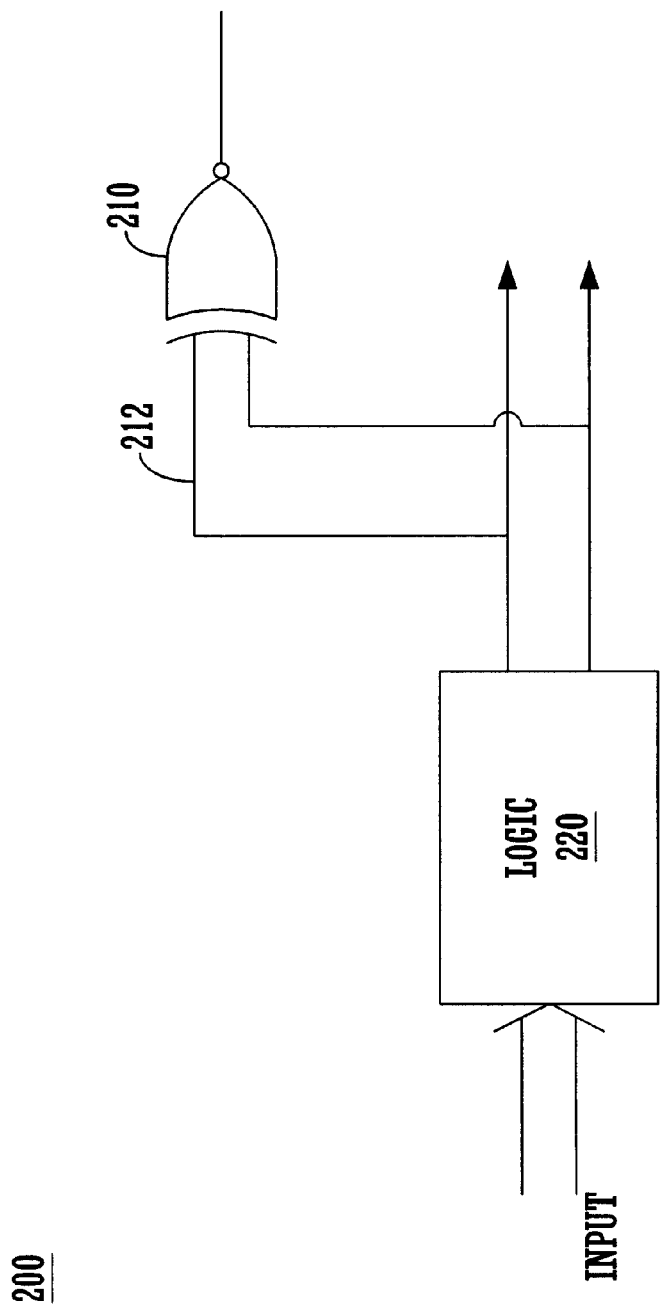
FIG. 2A is a schematic diagram of another circuit having an internal node that is difficult to be tested.
Figure 2B:
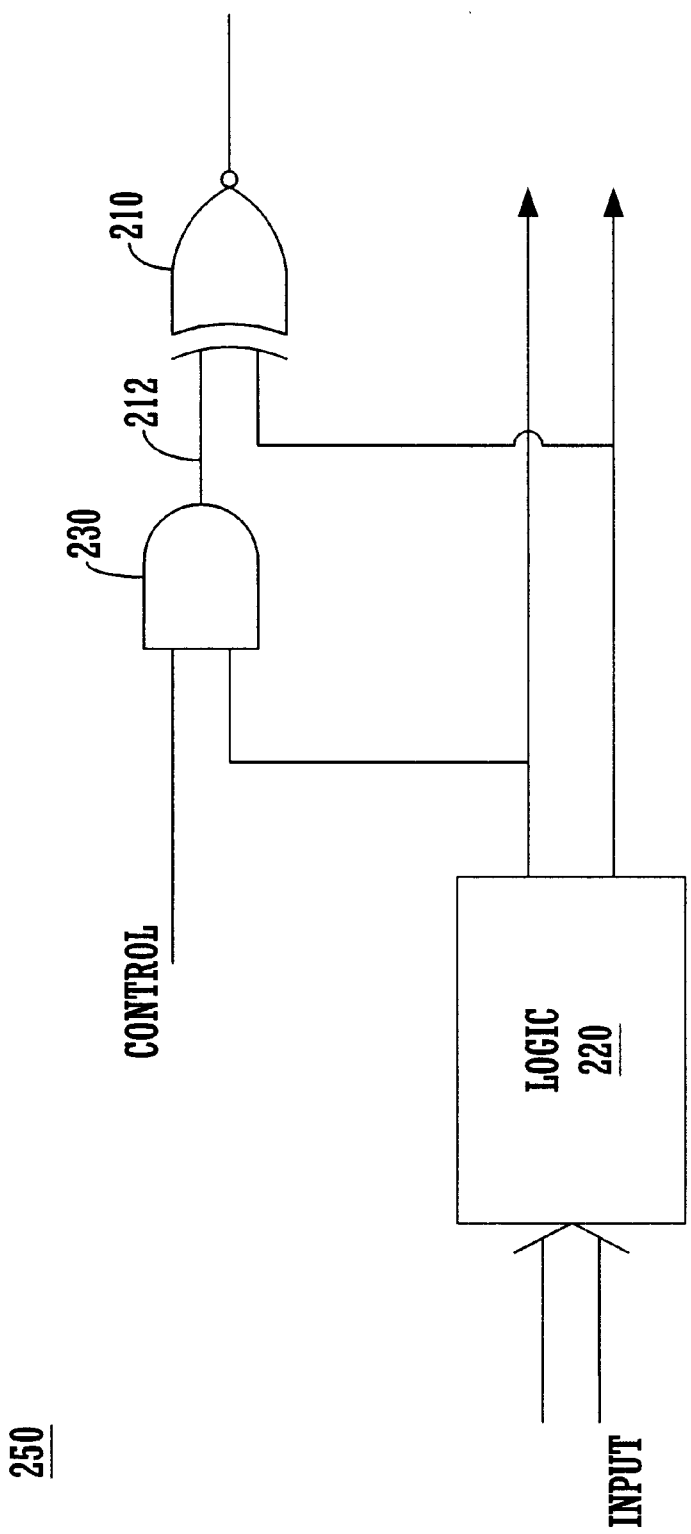
FIG. 2B is a schematic diagram of the circuit of FIG. 2A with a control point added using prior art techniques.
Figure 3:
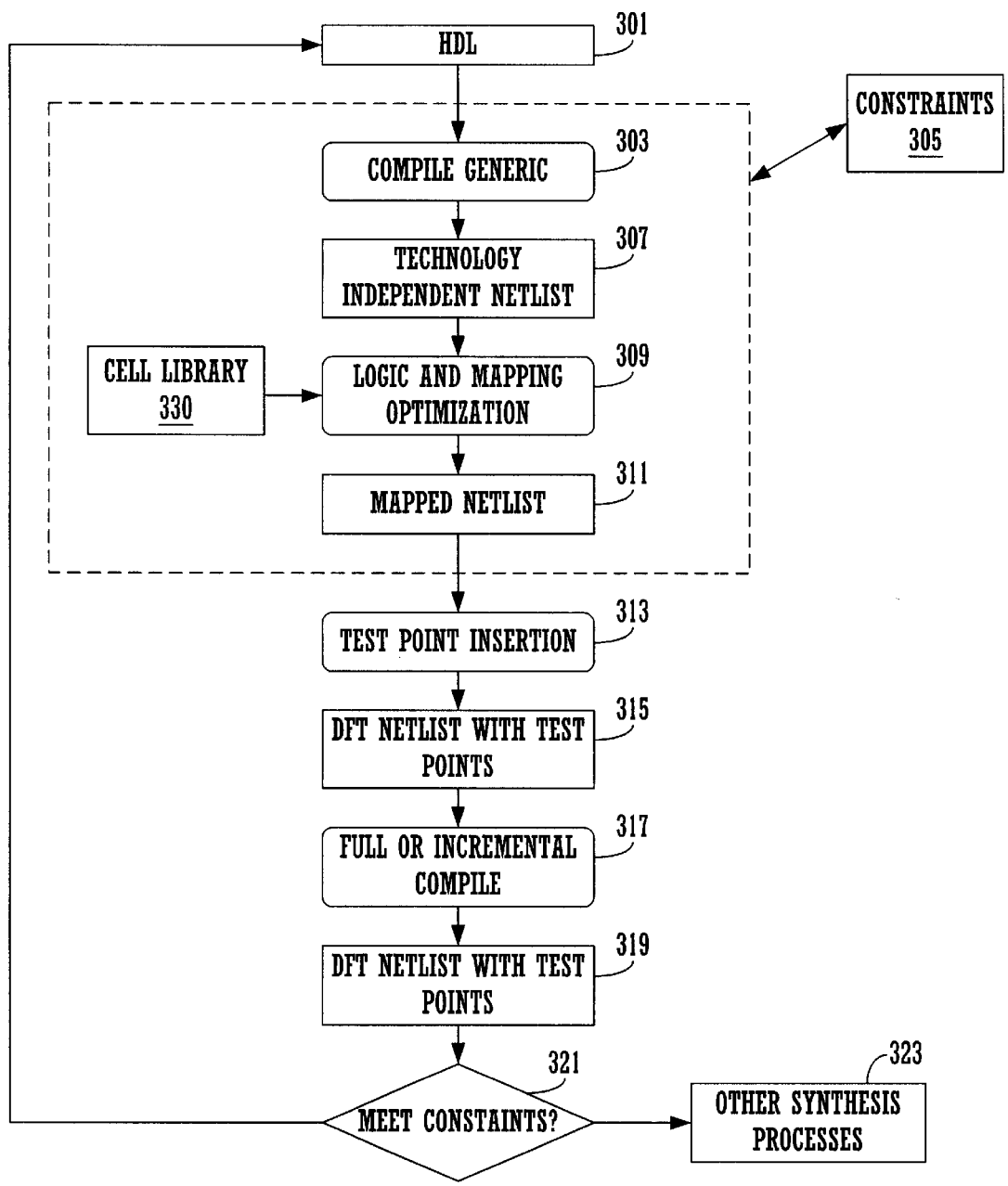
FIG. 3 is an exemplary flow chart diagram of a conventional logic synthesis process including a test point insertion process.
Figure 4:
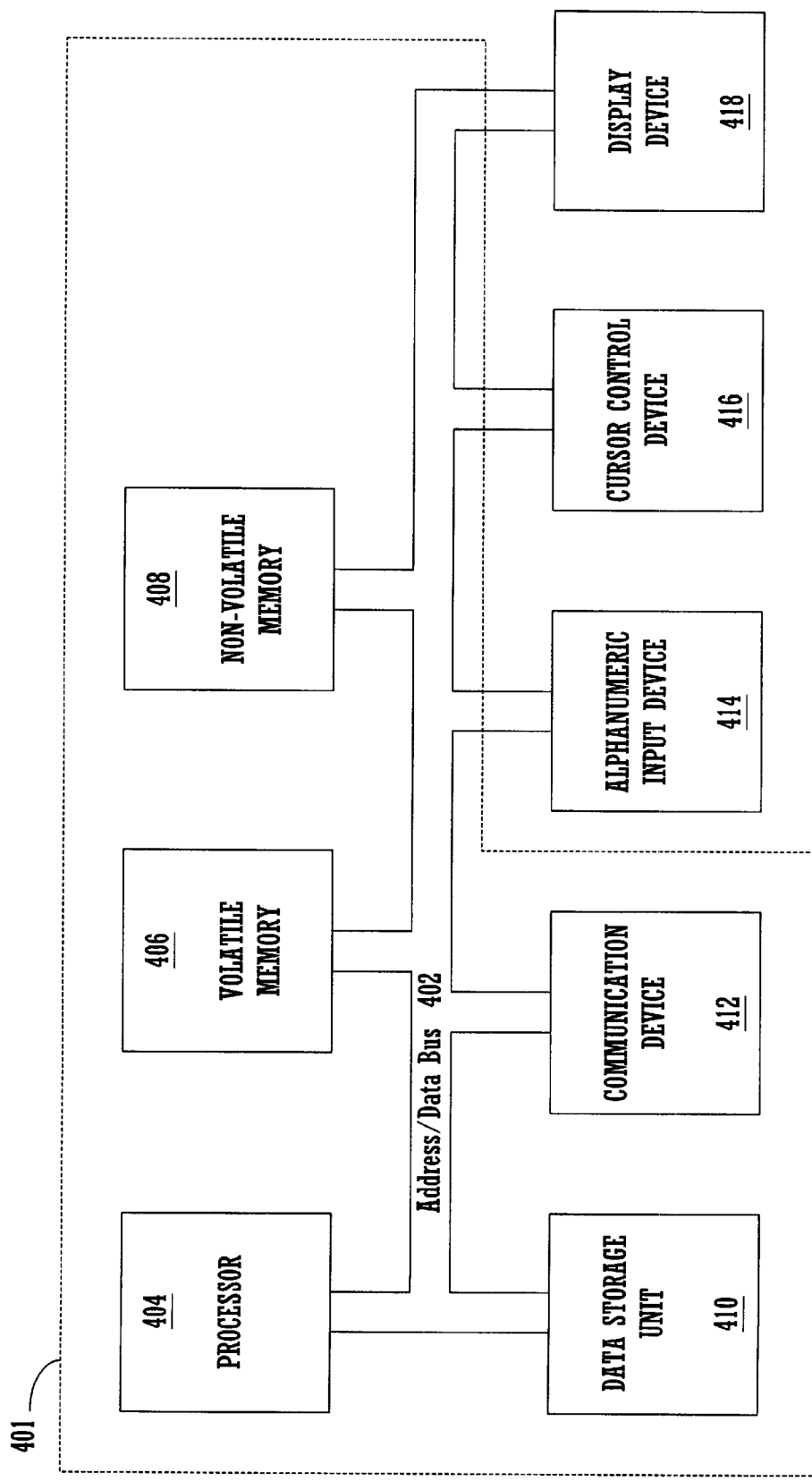
FIG. 4 is a CAD system including a computer system operable to implement the elements of the present invention.

Specific aspects of the present invention are operable within a programmed computer aided design (CAD) system. A CAD system operable to implement the elements of the present invention is shown in FIG. 4. In general, the CAD system of the present invention includes a computer system 401 which includes an address/data bus 402 for communicating information including address, data, and control signals, a central processor 404 coupled with bus 402 for processing information and instructions, a volatile memory 406 (e.g., random access memory RAM) coupled with the bus 402 for storing information and instructions for the central processor 404 and a non-volatile memory 408 (e.g., read only memory ROM) coupled with the bus 402 for storing static information and instructions for the processor 404, a data storage device 410 such as a magnetic or optical disk and disk drive coupled with the bus 402 for storing information and instructions, a display device 418 coupled to the bus 402 for displaying information to the computer user, an alphanumeric input device 414 including alphanumeric and function keys coupled to the bus 402 for communicating information and command selections to the central processor 404, a cursor control or directing device 416 coupled to the bus 402 for communicating user input information and command selections to the central processor 404, and a signal generating device 412 coupled to the bus 402 for communicating signals that are input and output from the system 401.

Program instructions executed by the CAD system can be stored in RAM 406, ROM 408, or in the storage device 410 and when executed in a group can be referred to as logic blocks or procedures. It is appreciated that data produced at the various logic synthesis stages of the present invention, including representations of the different levels of abstraction of the integrated circuit design, can also be stored in RAM 406, ROM 408 or the storage device 410 as shown in FIG. 4.

The display device 418 of FIG. 4 utilized with the computer system 401 of the present invention may be a liquid crystal device, cathode ray tube, or other display device suitable for creating graphic images and alphanumeric characters recognizable to the user. The cursor control device 416 allows the computer user to dynamically signal the two dimensional movement of a visible pointer on a display screen of the display device 418. Many implementations of the cursor control device are known in the art including a trackball, mouse, joystick or special keys on the alphanumeric input device 414 capable of signaling movement of a given direction or manner of displacement.

Figure 5:
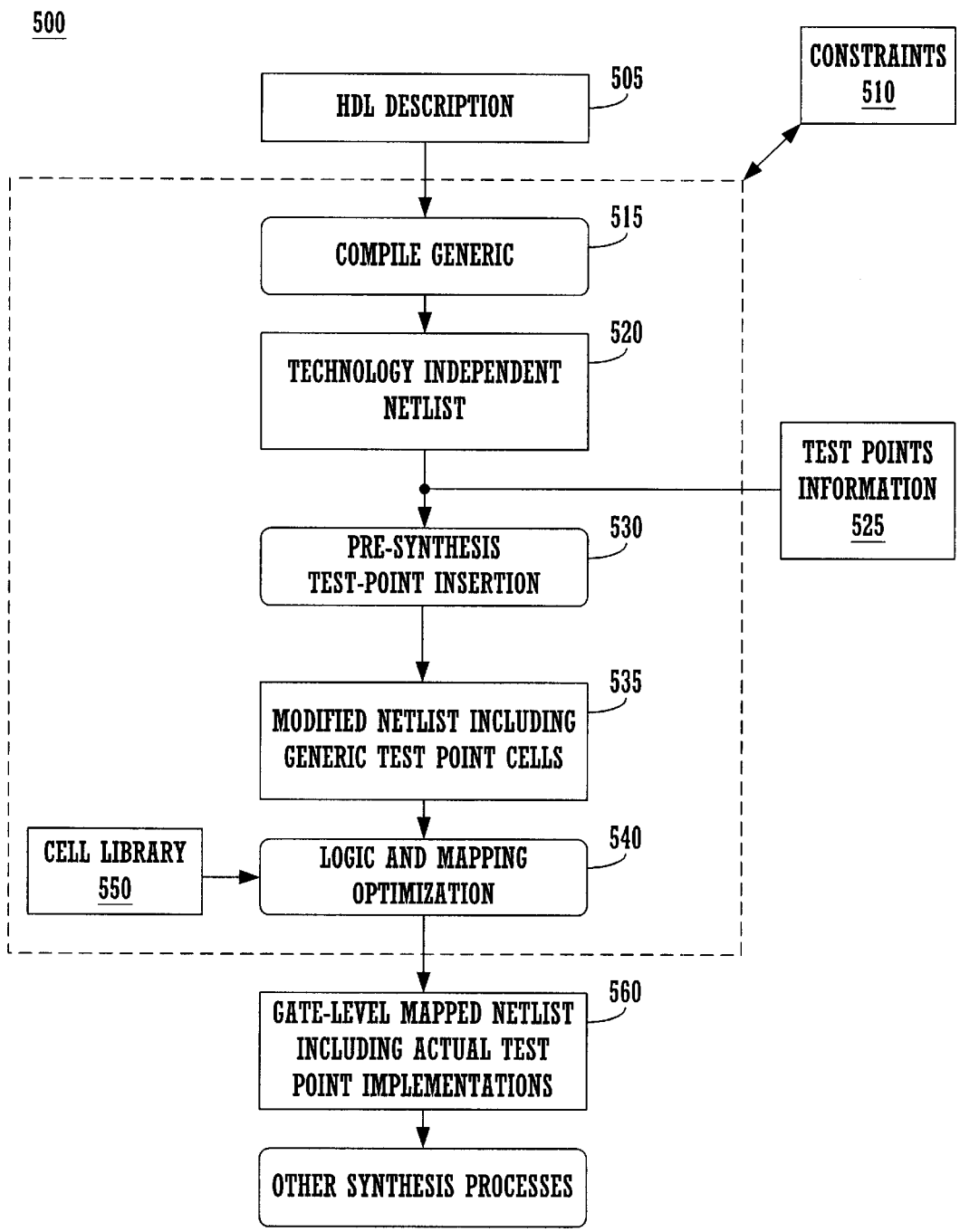
FIG. 5 is a flow diagram of a synthesis process, the logic blocks of which are implemented within the computer controlled CAD system described in FIG. 4, in accordance with embodiments of the present invention.

FIG. 5 is a flow diagram of a synthesis process 500 in accordance with embodiments of the present invention and its logic blocks are implemented within the computer controlled CAD system described above. As illustrated, synthesis process 500 receives an HDL description 505 of an integrated circuit along with a set of design constraints 510 (including design rule limitations, and performance limitations, such as area, timing, power, etc.) that are pertinent to the circuit described by the HDL description 505. Design rules as used herein refer to maximum fanout, maximum signal transition time, and maximum node capacitance. The HDL description 505 can be of a number of different formats, such as VHDL or Verilog and can also represent an entire IC design, but typically represents a module for the overall IC design. The HDL description 505 can be stored in a computer memory unit (e.g., unit 406 or 408), and is fed into an optional generic compiler logic block 515 that is well known in the art. This generic computer 515 transforms the HDL description 505 into a technology independent netlist 520 that complies with the constraints 510. The netlist 520 is a list of technology independent components or operators and the interconnections (e.g., nets) between them.

With reference still to FIG. 5, process 500 provides for a pre-synthesis test point insertion process 530 which allows a user (or other DFT tools) of the CAD system to insert a test point on a particular net of netlist 520. In the present embodiment, test point data 525 originated from an external source (e.g., a user of the CAD system or an automatic test pattern generation tool, etc.) is provided to the pre-synthesis test point insertion process 530. The test point data 525 specifies the particular nets of the netlist 520 that require test points. In addition, the test point data 525 specifies the types of test points (e.g., force_0, control_1, etc.) that are desired at each location. The pre-synthesis test point insertion process 530 then automatically inserts generic test point circuits into the netlist 520, and transforms the technology independent netlist 520 into a modified unmapped netlist 535.

According to the present embodiment, pre-synthesis test point insertion process 530 converts the test point data 525 into appropriate control signals for configuring the generic test point circuits. In one particular embodiment of the present invention, pre-synthesis test point insertion process 530 uses a set of pre-defined control signals for configuring the generic test point circuit. Table 1 below describes an exemplary set of pre-defined control signals and their respective functionality.

TABLE 1

| Signal Name | Signal Attribute | Functionality |
| --- | --- | --- |
| DIN | test_data_in | Input port of a test point circuit where the source segment of a net to be controlled is connected |
| DOUT | test_data_out | Output port of a test point circuit which is connected to the destination segment of a net to be controlled |
| TD | test_ctl_force_data_in | Input port of a test point circuit for applying a specific value to the net in Test Mode |
| OBIN | test_observe_data_in | Input port of a test point circuit where the source segment of a net to be observed is connected |
| OBOUT | test_observe_data_out | Output port of a test point circuit which is connected to the destination segment of a net to be observed |
| TM | test_mode_control | Input port of a test point circuit for receiving a TM signal, which determines whether the generic test point circuit is in a Test Mode or a Functional Mode |
| DRVR | test_data_driver | Output port of a test point circuit for driving a tri-stated net |
| CLK | test_observe_clock | Input port of a test point circuit for receiving a clock signal |
| TPE | test_point_enable | Input port of a test point circuit which can make the test point circuit transparent during test mode |

With reference still to FIG. 5, the modified unmapped netlist 535, including the pre-synthesis test point(s), is then input into a design compiler 540 that includes a computer implemented logic optimization procedure and a mapping procedure which interfaces with a technology dependent cell library 550 (e.g., from LSI Logic, or VLSI Technology, or Texas Instruments, or Xilinx Technologies, etc.). The cell library 550 contains specific information regarding the cells of the specific technology selected such as the cell logic, number of gates, area consumption, power consumption, pin descriptions, etc., for each cell in the library 550. Logic optimization procedure of block 540 includes logic reduction and degeneration procedures that remove any redundant logic of the generic test point circuits into actual test point implementations. Mapping procedure of block 540 generates a gate level mapped netlist 560 that is technology dependent having cells specifically selected to satisfy the constraints 510. The gate level netlist 560 thus contains the mission mode circuitry of the integrated circuit and the actual test point implementations of the generic test point circuit inserted by step 530.

Thereafter, other DFT processes such as scan insertion, and other synthesis processes are performed on the gate-level netlist 560. It should be appreciated that the technology independent netlist 520 is not a gate level netlist. Rather, netlist 520 contains only generic logic components interconnected by nets. Technology independent netlist 520 is also known as an "unmapped" netlist. Thus, by providing a generic test point circuit that is unmapped, the present invention allows the insertion of test points even before a gate-level mapped netlist is materialized. Further, because the test point circuits are inserted before the logic optimization and mapping processes of block 540, the problem of constraint violation by subsequently inserted test point circuits is avoided.

It is important to note that it is not necessary for the test point data 525 to provide implementation information of the test point circuitries. Rather, the generic test point circuits inserted by pre-synthesis test point insertion process 530 are automatically reduced or degenerated into actual test point implementations by subsequent logic reduction and optimization processes. In this manner, only a handful of generic test point designs need be stored within the CAD system. An exemplary logic reduction process is described further below.

Figure 6A:
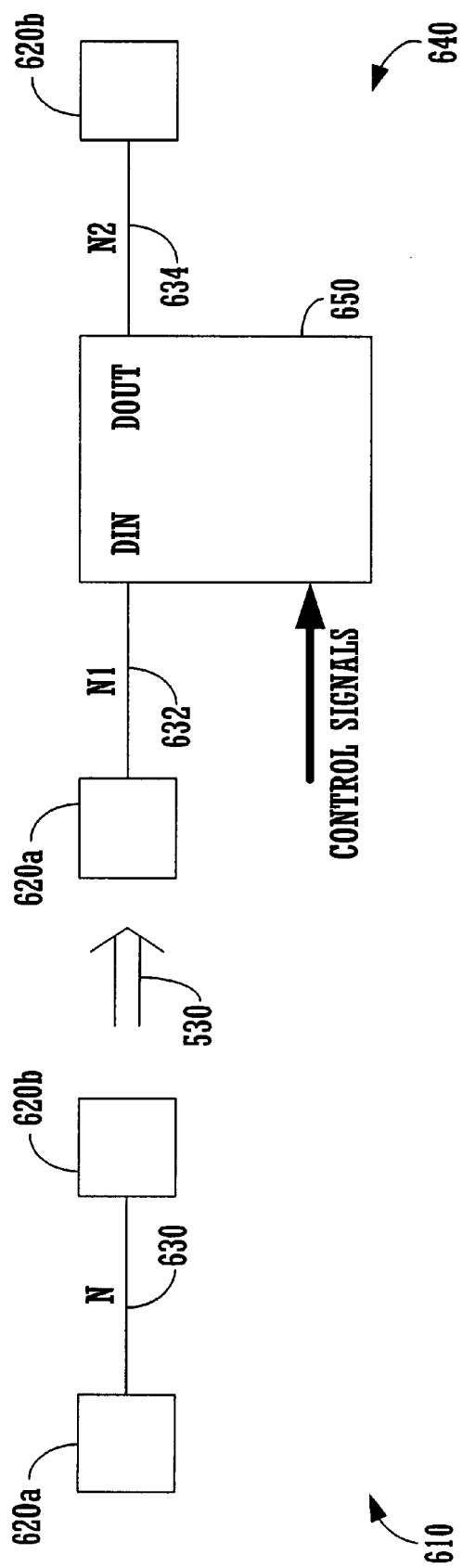
FIG. 6A is a logical block diagram illustrating the pre-synthesis test point insertion process according to one embodiment of the present invention.

FIG. 6A is a logical block diagram illustrating the pre-synthesis test point insertion process (e.g., process 530) according to one embodiment of the present invention. As illustrated, an unmapped netlist 610 having two generic logic components 620a–620b interconnected by a net 630 is transformed by pre-synthesis test point insertion process 530 into a modified unmapped netlist 635 which includes logic components 620a–620b, a source net 632, a target net 634, and a generic test point circuit 650 inserted between source net 632 and target net 634. Particularly, source net 632 is coupled to an input data port (DIN) and target net 634 is coupled to an output data port (DOUT) of the generic test point circuit 650. In addition, generic test point circuit 650 includes input ports for receiving control signals described in Table 1 above. An exemplary implementation of the generic test point circuit 650 is described below.

Figure 6B:
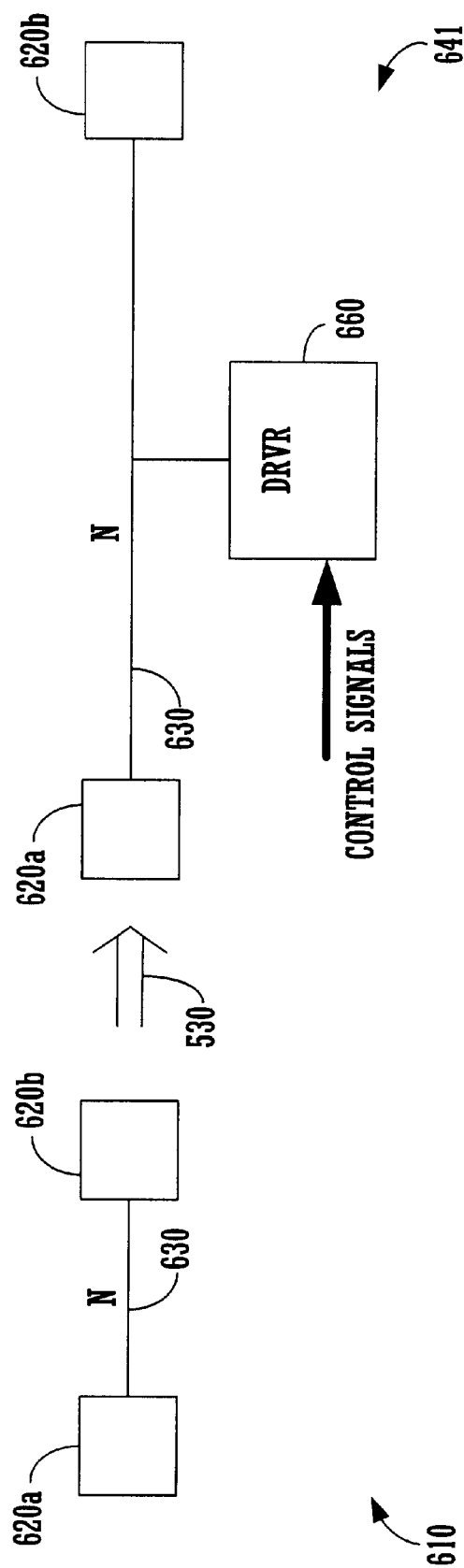
FIG. 6B is a logical block diagram illustrating the pre-synthesis test point insertion process in accordance with another embodiment of the present invention.

FIG. 6B is a logical block diagram illustrating the pre-synthesis test point insertion process 530 in accordance with another embodiment of the present invention. In the embodiment as illustrated in FIG. 6B, unmapped netlist 610 is transformed by pre-synthesis test point insertion process 530 into a modified netlist 641 which includes an additional test point circuit 660. However, unlike the embodiment illustrated in FIG. 6A, the net 630 is not split into two segments. Rather, the net 630 is coupled to a port DRVR of the generic test point circuit 660. This is used for tri-state nets. Further, the generic test point circuit 660 includes an input port for receiving control signals that are described in Table 1 above. An exemplary implementation of the generic test point circuit 660 is described below.

Figure 6C:
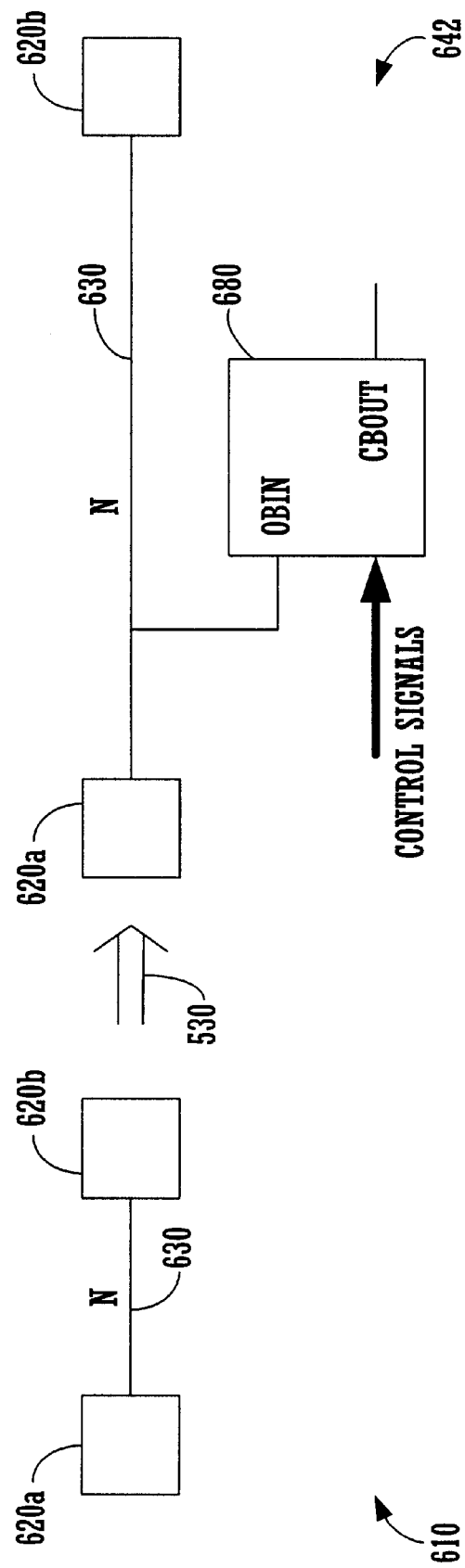
FIG. 6C is a logical block diagram illustrating the test point insertion process in accordance with yet another embodiment of the present invention.

FIG. 6C is a logical block diagram illustrating the test point insertion process 530 in accordance with yet another embodiment of the present invention. As illustrated in FIG. 6C, unmapped netlist 610 is transformed into modified netlist 642 which includes an inserted "observe-only" generic test point circuit 680. In particular, a fan out is added to the net 630 through which the values on the net 630 can be observed via an OBIN port of the generic test point circuit 680. Further, as illustrated, the "observe-only" test point circuit 680 further includes an OBOUT port for connecting to an output pin or another net. Generic test point circuit 680 is also configured for receiving a plurality of control signals described above in Table 1. An exemplary implementation of the generic test point circuit 660 is described below.

Figure 7A:
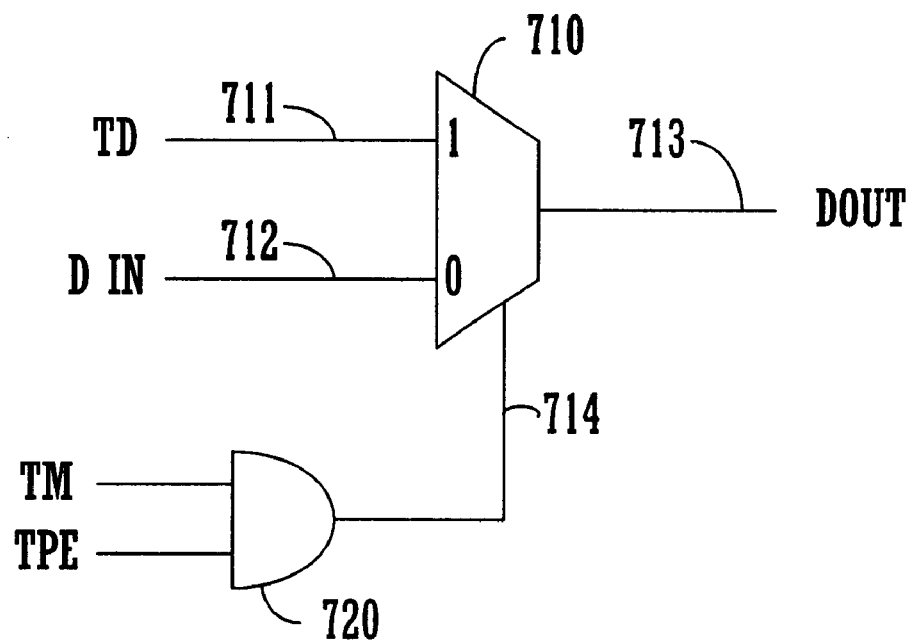
FIG. 7A is a schematic diagram of one implementation of a pre-synthesis test point circuitry according to one embodiment of the present invention.

FIG. 7A is a schematic diagram of one implementation of generic test point circuitry 650 according to the present invention. In the particular embodiment as illustrated, implementation details of the generic test point circuit 650 are stored within a test point design library of a CAD system, and are retrievable by the CAD system during a logic synthesis process such as pre-synthesis test point insertion process 530 of FIG. 5.

As illustrated, test point circuit 650 includes a multiplexer 710 and an AND gate 720. Multiplexer 710 has two input lines 711 and 712 for receiving test data TD and input data DIN, respectively. Multiplexer 710 also has an output line 713 for output signal DOUT, and a select line 714 for receiving a select signal from AND gate 720. In response to the select signal, the multiplexer 710 selects one of the input lines 711 and 712 to be gated to output line 713. In the present embodiment, the select signal is generated from signals TM and TPE. In one embodiment of the present invention, output line 713 is for coupling to target net 634 (FIG. 6A), input line 712 is for coupling to source net 632 (FIG. 6A). The signals TD, TM, TPE, DIN and DOUT are described above in Table 1.

Figure 7B:
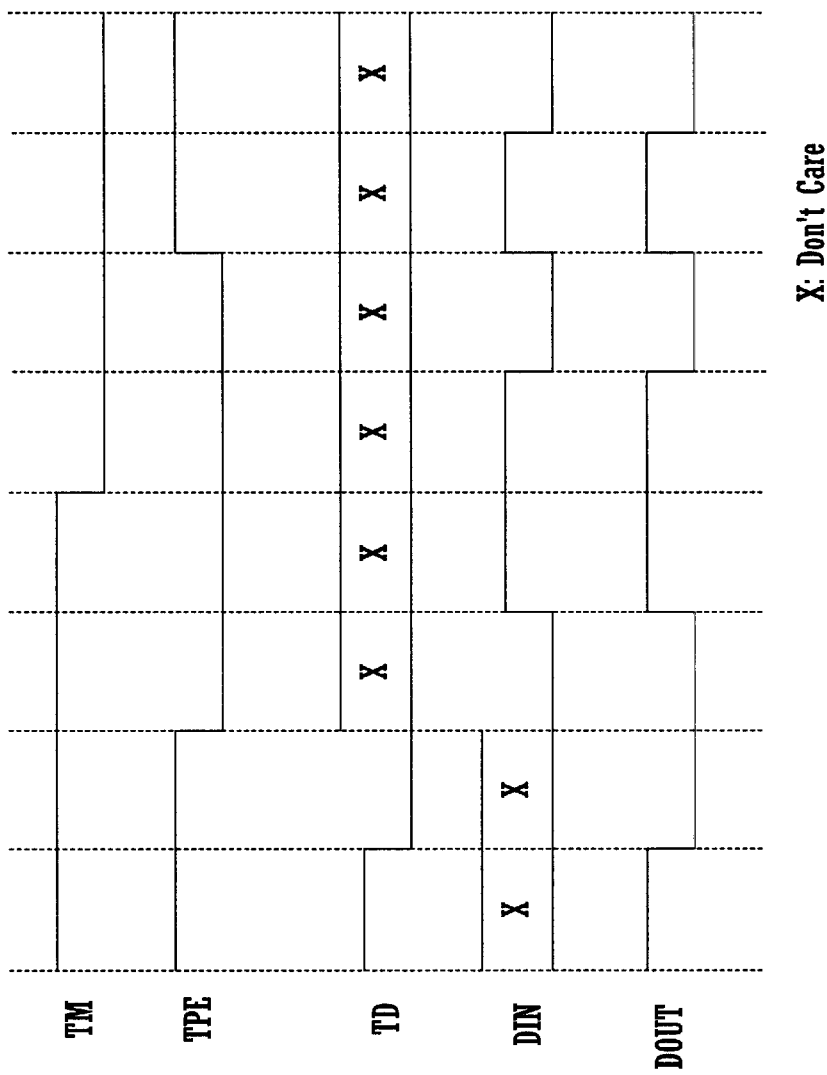
FIG. 7B illustrates a waveform diagram for the pre-synthesis test point circuit of FIG. 7A in furtherance of the present invention.

FIG. 7B illustrates a timing diagram or waveform diagram 730 of the generic test point circuit 650 of FIG. 7A. As illustrated, waveform diagram 730 includes waveforms for signals TM, TPE, TD, DIN, and DOUT. As shown in FIG. 7B, when TM and TPE are asserted, test data TD is selected and is gated to the output DOUT. When TM is asserted and TPE is not asserted, the data input signal DIN is selected and is gated to the output DOUT. When TM is not asserted, the input data DIN is also gated to the output DOUT.

According to the present embodiment, the pre-synthesis test point insertion process 530 can configure generic test point circuit 650 to one of the following functionalities: force-0, force-1, force-0/1, control-0, control-1, control-0/1. Table 2 below illustrates the relationships between the functionality of the test points and the control signals.

TABLE 2

| TD | TM | TPE | Functionality |
| --- | --- | --- | --- |
| 0 | 1 | 1 | Force-0, test point is forced to 0 when TM is asserted |
| 1 | 1 | 1 | Force-1, test point is forced to 1 when TM is asserted |
| 0/1 | 1 | 1 | Force-0/1, test point is forced to 0 or 1 when TM is asserted |
| 0 | 1 | 0/1 | Control-0, test point is forced to 0 when TM and TPE are asserted, and is transparent when TPE is unasserted |
| 1 | 1 | 0/1 | Control-1, test point is forced to 1 when TM and TPE are asserted, and is transparent when TPE is unasserted |
| 0/1 | 1 | 0/1 | Control-0/1, test point is forced to 0 or 1 when TM and TPE are asserted, and is transparent when TPE is unasserted |
| — | 0 | — | Functional Mode, test point is transparent |

It should be noted that it is not necessary to provide the implementation detail of the generic test point circuit 650. Rather, the user (or other synthesis tools) can simply specify the intentions (e.g., type and desired value for the test point), and the pre-synthesis test point insertion process 530 converts the "intentions" into appropriate control signals for configuring the generic test point circuitry 650. Finally, logic synthesis and optimization processes (e.g., process 540) of the CAD system automatically reduces any redundant logic in the generic test point circuit 650 and generates an actual test point implementation that performs the desired functionality. It should also be appreciated that the signals TM, TPE, and TD are exemplary only, and that other control signals may be applied for configuring the generic test point circuit 650.

Figure 8A:
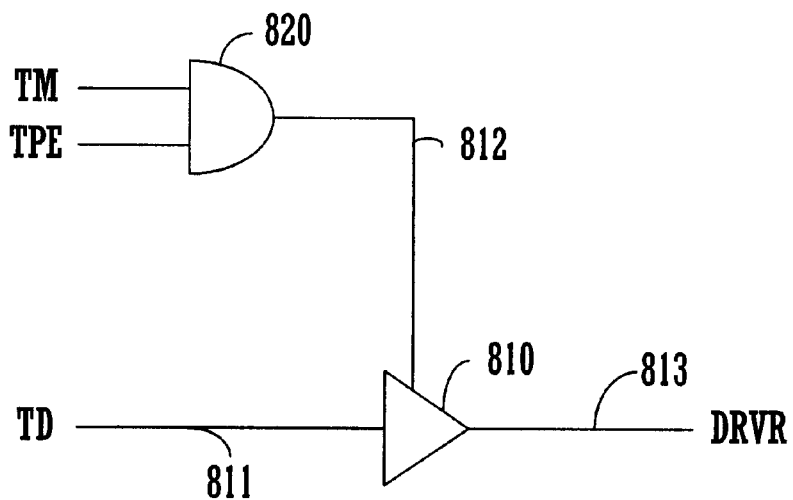
FIG. 8A is a schematic diagram of one implementation of a pre-synthesis test point circuit according to another embodiment of the present invention.

FIG. 8A is a schematic diagram of one implementation of generic test point circuit 660 (FIG. 6B) according to one embodiment of the present invention. As illustrated, test point circuit 660 includes a tri-state buffer 810 and an AND gate 820. Tri-state buffer 810 has two input lines 811 and 812 for receiving test data TD and a control signal from AND gate 820. Tri-state buffer 810 also has an output line 813 for output signal DRVR. In response to the control signal, the tri-state buffer 810 drives the output line 813 to a high-impedance (Hi-Z) state, or gates the logic signal TD to the output line 813. In the present embodiment, the control signal is generated from signals TM and TPE. In one embodiment of the present invention, output line 813 is for coupling to net 630 (FIG. 6B).

Figure 8B:
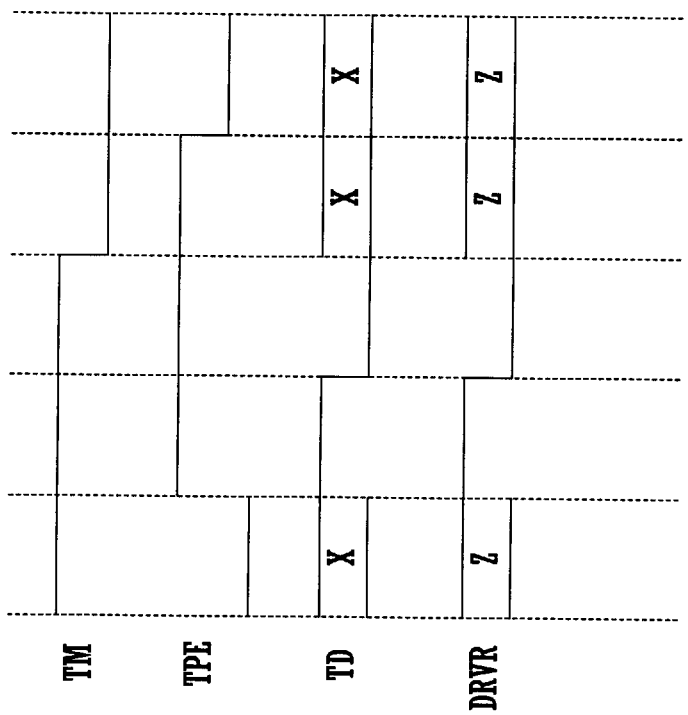
FIG. 8B illustrates a waveform diagram for the pre-synthesis test point circuit illustrated in FIG. 8A in furtherance of the present invention.

FIG. 8B illustrates a timing diagram or waveform diagram 830 of the generic test point circuit 660 of FIG. 8A. As illustrated, waveform diagram 830 includes waveforms for signals TM, TPE, TD, and DRVR. When TM and TPE are asserted, the input signal TD is gated to the output DRVR. At other times, the output DRVR driven to a Hi-Z state.

According to the present embodiment, the pre-synthesis test point insertion process 530 can configure generic test point circuit 660 to one of the following functionalities: tri-state force-0, tri-state force-1, tri-state force-0/1, tri-state control-0, tri-state control-1 and tri-state control-0/1. Table 3 below illustrates the relationships between the functionality of the test points and the control signals.

TABLE 3

| TD | TM | TPE | Test Point Functionality |
|---|---|---|---|
| 0 | 1 | 1 | tri-state force-0; test point is forced to 0 when TM is asserted |
| 1 | 1 | 1 | tri-state force-1; test point is forced to 1 when TM is asserted |
| 0/1 | 1 | 1 | tri-state force-0/1; test point is forced to 0 or 1 when TM is asserted |
| 0 | 1 | 0/1 | tri-state control-0; test point is forced to 1 when TM and TPE are asserted, and is transparent (e.g., Hi-Z) when TPE is unasserted |
| 1 | 1 | 0/1 | tri-state control-1; test point is forced to 1 when TM and TPE are asserted, and is transparent (e.g., Hi-Z) when TPE is unasserted |
| 0/1 | 1 | 0/1 | tri-state control-0/1; test point is forced to 0 or 1 when TM and TPE are asserted, and is transparent (e.g., Hi-Z) when TPE is unasserted |
| — | 0 | — | Functional mode |

It should be noted that it is not necessary to provide the implementation detail of the generic test point circuit 660. Rather, the user (or other synthesis tools) can simply specify the intention (e.g., type and desired value for the test point), and the pre-synthesis test point insertion process 530 converts the "intentions" into appropriate control signals for configuring the generic test point circuitry 660. Finally, logic synthesis and optimization processes of the CAD system automatically reduces any redundant logic in generic test point circuit 660 and generates an actual test point implementation for performing the desired functionality. It should also be appreciated that the signals TM, TPE, and TD are exemplary only, and that other control signals may be applied for configuring the generic test point circuit 660.

Figure 9A:
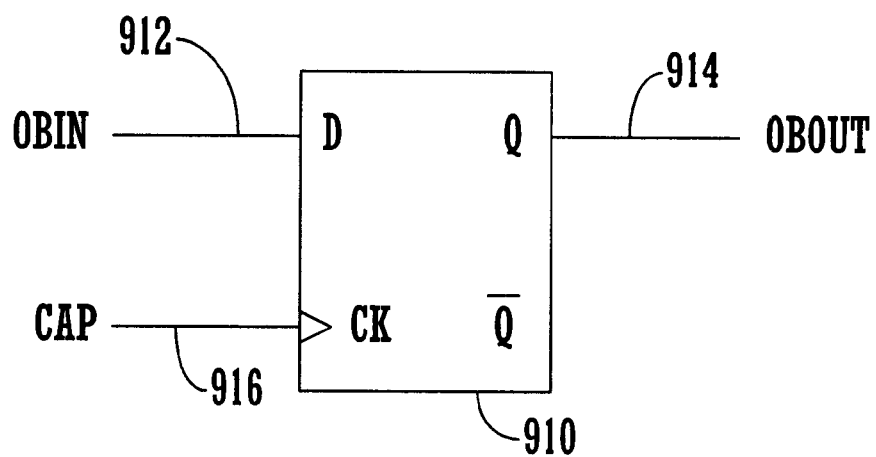
FIG. 9A is a schematic diagram of an "observe-only" pre-synthesis test point circuit according to another embodiment of the present invention.

FIG. 9A is a schematic diagram of an "observe-only" generic test point circuit 680 (FIG. 6B) according to the present embodiment. The generic test point circuit 680 is inserted by pre-synthesis test point insertion procedure 530 of process 500. As illustrated, test point circuit 680 includes a D-type flip-flop 910 having an input line 912 for receiving observed data OBIN, an output line 914 for driving output data OBOUT, and a clock line 916 for receiving a capture clock signal CAP. According to the present embodiment, input line 912 is configured for coupling to net 630 (FIG. 6C). The logic value of the net 630 can be captured at the positive edge of the capture clock signal CAP.

Figure 9B:
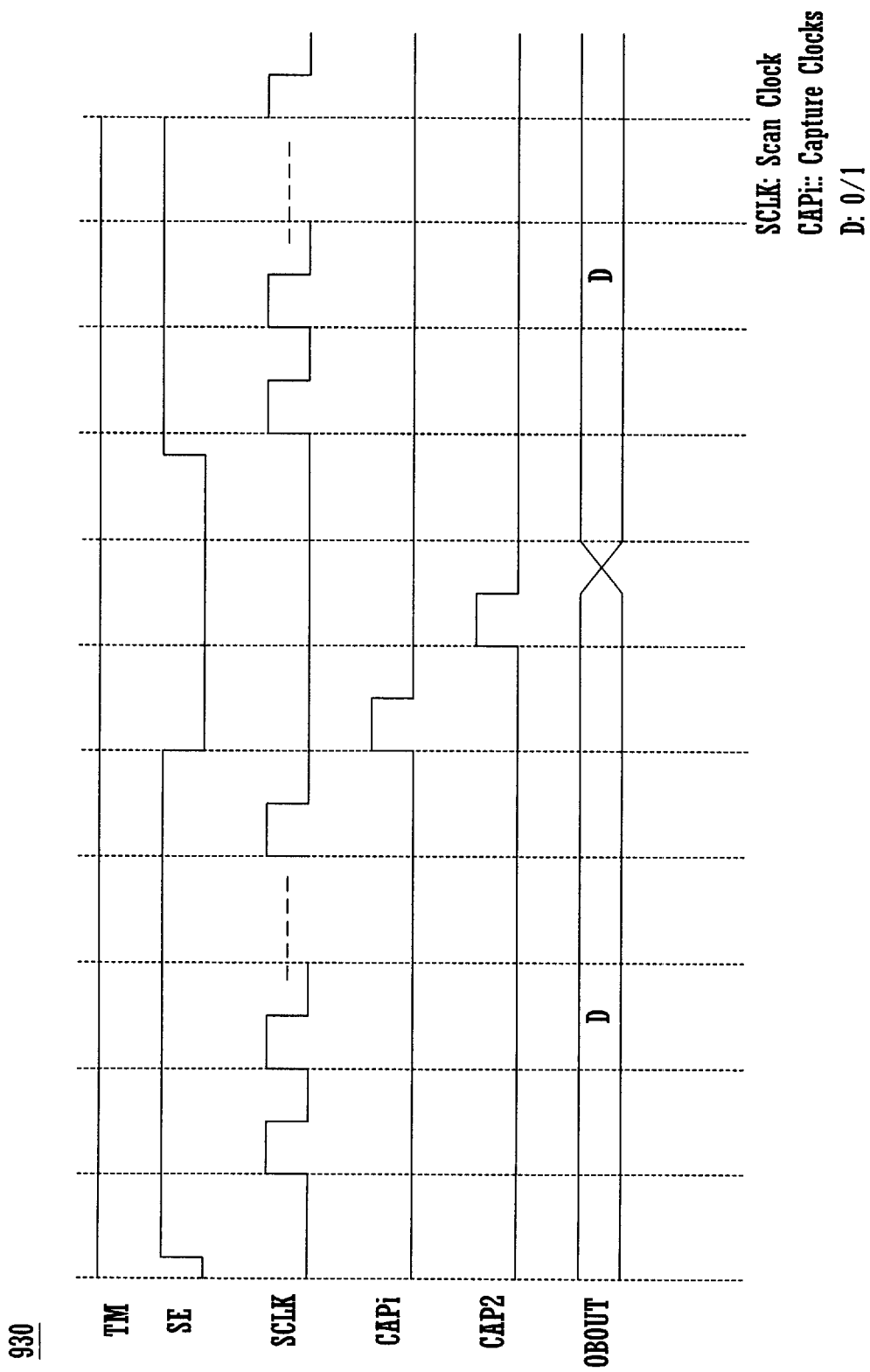
FIG. 9B illustrates a waveform diagram for the pre-synthesis test point circuit illustrated in FIG. 9A in furtherance of the present invention.

FIG. 9B illustrates a timing diagram or waveform diagram 930 for the generic test point circuit 680 of FIG. 9A. In the present embodiment, the "observe only" generic test point circuit 680 is used in conjunction with a scan chain. As illustrated, waveform diagram 680 includes waveforms for signals TM, SE, SCLK, CAP1, CAP2, and OBIN and OBOUT. When TM is asserted, the values on OBIN are captured on a separate capture clock CAP2. It should also be noted that the capture clocks CAP1 and CAP2 are inactive when the scan-enable signal SE is asserted. That is, the observe only test point circuit 680 remains inactive until the scan enable signal is disabled. It should also be noted that the capture clocks for the generic test point circuits (e.g., circuit 680) may be different from functional capture clocks.

It should be noted that it is not necessary to provide the implementation detail of the generic test point circuit 680. Rather, the user of the CAD system or other synthesis tools can simply specify the intentions (e.g., type and desired logic value of the test point), and the pre-synthesis test point insertion process 530 automatically converts the "intentions" into appropriate control signals for configuring the generic test point circuit 680. It should also be appreciated that the signal CAP is exemplary only, and that other control signals may be applied for configuring the "observer-only" generic test point circuit 680.

Figure 10:
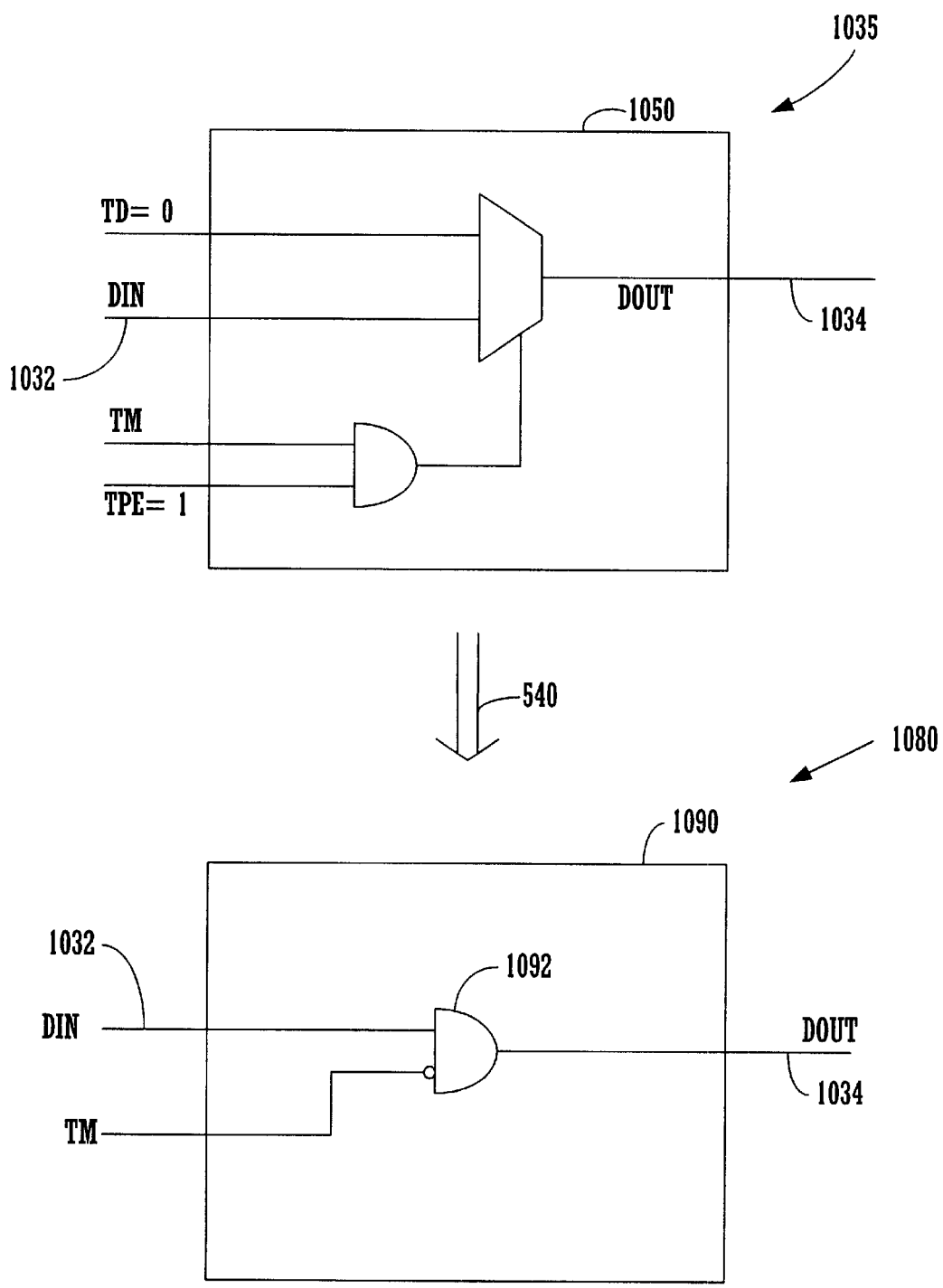
FIG. 10 illustrates the transformation of a generic test point circuit into an actual test point implementation using logic optimization process in accordance with the present invention.

FIG. 10 illustrates the transformation of a generic test point circuit into an actual test point implementation using logic optimization process 540 in accordance with the present invention. As illustrated, an modified unmapped netlist 1035 including a generic test point circuit 1050 is transformed by the logic optimization process 540 into a mapped netlist 1080 that includes an actual test point implementation 1090. As illustrated, a data input port DIN of the generic test point circuit 1050 is coupled to a source net 1032 and the data output port DOUT is coupled to a target net 1034. Further, generic test point circuit 1050 includes multiplexer 1010 and AND gate 1020. Multiplexer 710 is configured for receiving test data TD and input data DIN, and for selecting one of TD and DIN to be gated to DOUT according to signals TM and TPE.

According to the present invention, the pre-synthesis test point insertion process (e.g., process 530) configures the generic test point circuit 1050 as a "force_0" test point by setting TD to 0 (or FALSE) and by setting TPE to 1 (or TRUE). Logic optimization process 540 reduces or degenerates the generic test point circuit 1050 into actual "force_0" test point implementation 1090. As shown, test point implementation 1090 includes an AND gate 1092 that has an inverted input for receiving TM and an input for receiving DIN. Other test point implementations may be similarly obtained by setting the control signals TM, TPE and TD to different values.

The present invention, a method of and system for inserting test points within an integrated circuit design, has thus been disclosed. The present invention allows test points to be inserted into a netlist prior to logic synthesis processes. By performing logic synthesis after test points are inserted, the problem of constraint violation, which may occur if the testability circuits are added after logic synthesis, is obviated. In addition, the present invention provides for generic test point circuits that greatly simplify the process of pre-synthesis test point insertion. A user intending to insert test points can simply specify his intentions without providing detailed test point circuit designs. Moreover, the present invention may also be used in conjunction with other DFT processes, such as scan insertion, to improve the testability of an integrated circuit design. While the present invention has been described in particular embodiments, it should be appreciated that the present invention should not be construed as limited by such embodiments, but should be construed according to the claims below.

What is claimed is:

1. In a computer controlled electronic design automation system, a computer implemented method of inserting test points in an integrated circuit design, said method comprising the steps of:
   a) receiving an unmapped netlist description of said integrated circuit design, said unmapped netlist including a plurality of unmapped logic cells intercoupled by a plurality of nets;
   b) receiving data from an external source, said data indicating a test point to be inserted at a particular net of said unmapped netlist, said data further indicating a specific function to be performed by said test point;
   c) based on said data, inserting a generic test point circuit at said particular net of said unmapped netlist to generate a modified unmapped netlist; and
   d) performing a logic synthesis process on said modified unmapped netlist to generate a mapped netlist, wherein said logic synthesis process degenerates said generic test point circuit into an actual test point circuit for performing said specific function.

2. The method as recited in claim 1 wherein said logic synthesis process removes logic redundancy in said generic test point circuit to generate said actual test point circuit.

3. The method as recited in claim 1 wherein said generic test point circuit comprises:
   a first input port for receiving a test mode signal;
   a second input port for receiving a test point enable signal; and
   a third input port for receiving a test data signal.

4. The method as recited in claim 3 further comprising the step of configuring said generic test point circuit for said specific function by setting said test mode signal, said test point enable signal, and said test data signal to a set of predetermined values.

5. The method as recited in claim 4 further comprising the steps of:
   splitting said particular net into a source segment and a target segment;
   coupling a fourth input port of said generic test point circuit to said source segment to receive input data; and
   coupling an output port of said generic test point circuit to said target segment.

6. The method as recited in claim 4 further comprising the step of coupling a tri-stated output port of said generic test point circuit to said particular net.

7. The method as recited in claim 4 wherein implementation of said actual test point circuit is dictated by said test mode signal, said test point enable signal and said test data signal.

8. A computer readable memory having computer-readable program code embodied therein for causing a computer system to perform a method of inserting test points within an integrated circuit design, said method comprising the steps of:
   a) receiving an unmapped netlist description of said integrated circuit design, said unmapped netlist including a plurality of unmapped logic cells intercoupled by a plurality of nets;
   b) receiving data from an external source, said data indicating a test point to be inserted at a particular net of said unmapped netlist, said data further indicating a specific function to be performed by said test point;
   c) based on said data, inserting a generic test point circuit at said particular net of said unmapped netlist to generate a modified unmapped netlist; and
   d) performing a logic synthesis process on said modified unmapped netlist to generate a mapped netlist, wherein said logic synthesis process degenerates said generic test point circuit into an actual test point circuit for performing said specific function.

9. The computer readable memory as recited in claim 8 wherein said logic synthesis process removes logic redundancy in said generic test point circuit to generate said actual test point circuit.

10. The computer readable memory as recited in claim 8 wherein said generic test point circuit comprises:
    a first input port for receiving a test mode signal;
    a second input port for receiving a test point enable signal; and
    a third input port for receiving a test data signal.

11. The computer readable memory as recited in claim 10 wherein said method further comprises the step of configuring said generic test point circuit for said specific function by setting said test mode signal, said test point enable signal, and said test data signal to a set of predetermined values.

12. The computer readable memory as recited in claim 11 wherein said method further comprises the steps of:
    splitting said particular net into a source segment and a target segment;
    coupling a fourth input port of said generic test point circuit to said source segment to receive input data; and
    coupling an output port of said generic test point circuit to said target segment.

13. The computer readable memory as recited in claim 11 wherein said method further comprises the step of coupling a tri-stated output port of said generic test point circuit to said particular net.

14. The computer readable memory as recited in claim 11 wherein implementation of said actual test point circuit is dictated by said test mode signal, said test point enable signal and said test data signal.

15. An electronic design automation system comprising:
    a processor;
    a bus coupled to said processor; and
    a computer readable memory coupled to said bus and having stored therein computer readable program code for causing said electronic design automation system to perform a method of test point insertion, said method comprising the steps of:
    a) receiving an unmapped netlist description of said integrated circuit design, said unmapped netlist including a plurality of unmapped logic cells intercoupled by a plurality of nets;
    b) receiving data from an external source, said data indicating a test point to be inserted at a particular net of said unmapped netlist, said data further indicating a specific function to be performed by said test point;

c) based on said data, inserting a generic test point circuit at said particular net of said unmapped netlist to generate a modified unmapped netlist; and d) performing a logic synthesis process on said modified unmapped netlist to generate a mapped netlist, wherein said logic synthesis process degenerates said generic test point circuit into an actual test point circuit for performing said specific function.

16. The computer readable memory as recited in claim 15 wherein said logic synthesis process removes logic redundancy in said generic test point circuit to generate said actual test point circuit.

17. The computer readable memory as recited in claim 15 wherein said generic test point circuit comprises:

a first input port for receiving a test mode signal;

a second input port for receiving a test point enable signal; and a third input port for receiving a test data signal.

18. The computer readable memory as recited in claim 17 wherein said method further comprises the step of configuring said generic test point circuit for said specific function by setting said test mode signal, said test point enable signal, and said test data signal to a set of predetermined values.

19. The computer readable memory as recited in claim 18 wherein said method further comprises the steps of:

splitting said particular net into a source segment and a target segment;

coupling a fourth input port of said generic test point circuit to said source segment to receive input data; and coupling an output port of said generic test point circuit to said target segment.

20. The computer readable memory as recited in claim 18 wherein said method further comprises the step of coupling a tri-stated output port of said generic test point circuit to said particular net.

21. The computer readable memory as recited in claim 18 wherein implementation of said actual test point circuit is dictated by said test mode signal, said test point enable signal and said test data signal.

* * * * *